United States Patent [19]

Vahldiek

[11] 4,349,636

[45] Sep. 14, 1982

[54] METHOD FOR INCREASING THE DUCTILITY AND CONDUCTIVITY OF REFRACTORY CRYSTALS

[76] Inventor: Fred W. Vahldiek, 5851 Barrett Dr., Dayton, Ohio 45431

[21] Appl. No.: 263,665

[22] Filed: May 14, 1981

[51] Int. Cl.³ .................... C04B 35/52; C04B 35/58
[52] U.S. Cl. ........................................ 501/87; 501/88; 501/96; 501/97; 423/344; 423/345; 423/406; 423/439; 423/440; 423/492
[58] Field of Search ............... 264/239, 340; 423/344, 423/345, 406, 439, 440, 492; 501/86–88, 96, 97

[56] References Cited

U.S. PATENT DOCUMENTS

| | | | |
|---|---|---|---|
| 2,947,608 | 8/1960 | Hall | 23/209.1 |
| 2,947,610 | 8/1960 | Hall | 23/209.1 |
| 2,947,611 | 8/1960 | Bundy | 23/209.1 |
| 2,996,763 | 8/1961 | Wentorf | 18/47.5 |
| 3,107,395 | 10/1963 | Bundy | 18/16 |
| 3,313,004 | 4/1967 | Vahldiek | 18/34 |
| 3,316,062 | 4/1967 | Criseione et al. | 23/204 |
| 3,351,429 | 11/1967 | Timms | 23/204 |
| 3,399,256 | 8/1968 | Robinson et al. | 264/120 |
| 3,405,207 | 10/1968 | Vahldiek et al. | 264/120 |
| 4,108,670 | 8/1978 | Steiger | 106/40 R |

OTHER PUBLICATIONS

Nakano et al., High Temperature Hardness of IVa–Diborides Single Crystals, J. Less–Common, Met., 47, 259 (1976).

Vahldiek et al., Slip and Microhardness of IVa–VIa Refractory Materials, J. Less–Common Met. 55, 265 (1977).

*Primary Examiner*—James Poer
*Attorney, Agent, or Firm*—Donald J. Singer; William J. O'Brien

[57] ABSTRACT

A method for imparting ductility and very high electrical conductivity to very brittle refractory single crystals by subjecting said crystals to a hydrostatic deformation technique at room temperature and at pressures of from about 5 to 25 kilobars.

4 Claims, 1 Drawing Figure

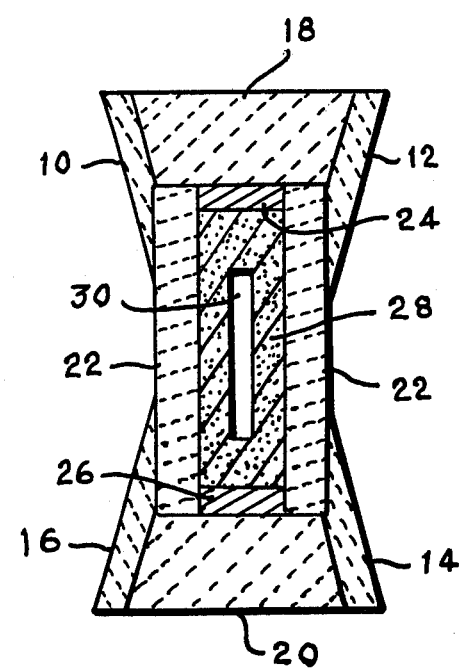

METHOD FOR INCREASING THE DUCTILITY AND CONDUCTIVITY OF REFRACTORY CRYSTALS

STATEMENT OF GOVERNMENT INTEREST

The invention described herein may be manufactured and used by or for the Government for governmental purposes without the payment of any royalty thereon.

FIELD OF THE INVENTION

This invention relates to a method for deforming brittle refractory crystals and to a resultant increase in their ductility and conductivity. More particularly, this invention concerns itself with the macroscopic deformation at room temperature of very brittle titanium boride crystals.

BACKGROUND OF THE INVENTION

Refractory materials, such as borides, carbides, nitrides and silicides of the transition metals, as well as silicon carbide and trisilicon tetranitride find utilization in a wide variety of industrial applications because of their hardness, chemical inertness, and high melting point characteristics. They are used as abrasives, refractory materials, cutting tools, in high speed machinery applications, and for compacting by powder metallurgical techniques. Their unique physical characteristics would make them especially useful for a number of jet engine applications except for their inherent brittleness. These normally high temperature melting compounds, with their high hardness and strength, are extremely brittle. This severely limits their usefulness for jet engine applications which could otherwise take advantage of their unique properties. It would seem, therefore, that these materials should make excellent candidates as structural materials in the fabrication of jet engine components, such as turbine blades. Unfortunately, these refractory compounds exhibit a high degree of brittleness which severely limits their usefulness in the manufacture of certain machine components such as the hereinbefore mentioned turbine blades.

In accordance with this invention, however, it has been found that the problem of brittleness, which severely limits the utilization of carbides, borides and nitrides for certain industrial applications, can be overcome by effecting the macroscopic deformation of these very brittle refractory crystals through a unique pressure technique conducted at room temperature. The deformation occurs through an elastic-plastic mechanism on the crystallographic planes or slip planes of the hexagonal crystal structure. The resultant increase in ductility or workability of these high temperature materials at room temperature provides an unexpected improvement in their utility for various jet engine applications, such as in the fabrication of turbine blades and other turbine engine components. Their use as turbine engine components allows for high temperature operation resulting in improved fuel efficiency for jet engines. They also find utility in the manufacture of high speed machine lathe tools and high speed drills.

An additional benefit resulting from the present invention is the unexpected increase in electrical conductivity exhibited by the deformed crystals of the invention. This high conductivity borders on superconductivity at room temperature. At the present time, all known superconductors are only effective at cryogenic temperatures which are difficult to attain and maintain, thus limiting their practical use. However, with this invention the usefullness of refractory carbides, borides and nitrides can be extended to a marked degree—not only for jet engine and high speed tool applications, but also for various electronic applications requiring highly conductive materials capable of operating within an elevated temperature environment of high mechanical stress. For example, very high current switches often require structural materials having the very unique and extraordinary properties exhibited by the deformed crystals of this invention. In high speed computers, very fast switching devices are needed that can overcome the large resistance created when changing from a semiconductor range to a superconductive range. The present invention provides the means for fabricating fast switching devices that overcome the resistance problem because the superconductivity of the crystals of this invention occurs at room temperature.

SUMMARY OF THE INVENTION

According to the present invention, the inherent brittleness of refractory crystals, especially titanium diboride crystals, can be overcome by a unique deformation process. Deformation of the brittle titanium diboride crystals which the present invention concerns itself, takes place under hydrostatic conditions at a pressure of from about 5,000 to 25,000 atmospheres at 22° C. through an elastic-plastic deformation mechanism on the crystallographic planes of the hexagonal crystalline structure. The resulting titanium diboride single crystals unexpectedly exhibit properties of superconductivity at room temperature and measurable room temperature ductility under mechanical deformation. These extraordinary properties make these materials especially amenable for a wide variety of industrial applications which require the use of materials possessing their unique properties.

Accordingly, the primary object of this invention is to provide a method for effecting the macroscopic deformation of very brittle, refractory single crystals such as titanium diboride.

Still another object of this invention is to provide a method for imparting room temperature measurable ductility to very brittle titanium diboride single crystals.

A further object of this invention is to provide a method for imparting superconductivity at room temperature to titanium diboride crystals.

Still a further object of this invention is to provide a method for converting very brittle titanium diboride by means of a high pressure, elastic-plastic deformation technique at room temperature into a more ductile material which is useful for turbine engine applications because of its high hardness, high strength and resistance to oxidative degradation at temperatures up to 1000° C.

The above and still further objects and advantages of the present invention will become more readily understood upon consideration of the following detailed disclosure thereof when viewed in light of the accompanying drawing.

BRIEF DESCRIPTION OF THE DRAWING

In the Drawing:

The FIGURE illustrates in schematic form a high pressure cell suitable for use in the process of this invention.

DETAILED DESCRIPTION OF THE INVENTION

The present invention is predicated upon the discovery that the ductility and electrical conductivity properties of very brittle titanium diboride crystals can be significantly and unexpectedly increased by means of a novel hydrostatic, high pressure, elastic-plastic deformation technique at room temperature. The titanium diboride crystals of this invention are grown in a conventional manner from a melt and then macroscopically deformed into a variety of shapes such as hexagonal, trapezoidal, tetragonal or orthorhombic, and cubic by high pressure ranging from 5-25 Kilo bars (5,000 to 25,000 atmospheres) at room temperature (22° C.).

The deformed $TiB_2$ specimens of this invention showed slip of the $\{10\bar{1}0\}$ [0001] and (0001) $<11\bar{2}0>$ operating in $TiB_2$, indicative of plasticity. Electrical resistance measurements at 22° C. on tetragonal-shaped specimens resulted in $7 \times 10^{-6}$ ohms parallel to the c-axis. Perpendicular to the c-axis (one of the two cross sectional axes) zero and even negative resistances were measured indicating superconductivity of deformed $TiB_2$ crystals at room temperature.

The elastic-plastic deformation of high temperature materials, such as the $TiB_2$ of this invention, at room temperature shows the possibilities of using these brittle materials for turbine engine applications. $TiB_2$ has good oxidation resistance up to 1000° C. and also high strength. Also, the more ductile $TiB_2$ allows for turbine engine operation at much higher temperatures (up to 1000° C. = 1800° F.) which result in more efficient fuel usage at higher thrusts. The superconductivity of $TiB_2$ at room temperature has energy applications and allows for more efficient use of electrical energy for transmission lines, switches, and other related electronic devices.

In order to further illustrate the invention, reference is now made to the drawing which illustrates a conventional high pressure cell used to effect the deformation of the $TiB_2$ crystals of this invention. The high pressure cell of the drawing is a modified version of the device referred to in U.S. Pat. Nos. 3,313,004 and 3,405,207. As shown in the drawing, the cell comprises two conical shaped end pieces shown as 10, 12, 18 and 14, 16, 20 made of lava and which form a funnel wall at each end of the cell. Steel discs 24 and 26 plug the opposite ends of the cylinder 22 and a silver chloride inner cylinder 28 is disposed within the cylinder 22 and forms a lining for the specimen chamber 30.

The single crystals of $TiB_2$ used in this invention are formed in accordance with conventional processes such as vacuum fusion, carbon-arc or floating zone techniques. In vacuum fusion, a $TiB_2$ powder is placed in a tungsten vacuum furnace at temperatures of about 2500° to 3000° C. to form the crystals. Additional powder is then fed into the furnace through a fine feeding tube to grow larger crystals. In the carbon-arc technique, small seed crystals are used to grow larger crystals by feeding powder to the crystal growing apparatus within an inert atmosphere of argon. The crystals can then be purified by conventional floating zone or electron beam techniques. Generally, the crystals are formed in the shape of a cylinder approximately 7 mm in diameter by 10 mm in length.

In order to effect deformation in accordance with this invention, a cylindrically shaped specimen of the hexagonal $TiB_2$ crystals conventionally grown from a melt was placed in the specimen compartment 30 of the high pressure cell in the drawing. The cell in turn was placed in a modified "belt" type pressure apparatus similar to that reported in: U.S. Pat. Nos. 2,947,610, 2,947,611, and 2,996,763. A typical high pressure apparatus has also been previously reported by F. W. Vahldiek and C. T. Lynch in U.S. Pat. Nos. 3,313,004 and 3,405,207. The high pressure modified "belt" device was calibrated for pressure at room temperature using bismuth, thallium, and barium wire (0.01 cm in diameter) enclosed in Silver Chloride (AgCl) for the Bi I-II, Bi II-III, Tl II-III, and Ba II-III pressure transitions at 25.4, 27.0, 36.7, and 60 kilo bars, respectively (1 bar = 14.5 psi, 1 kilo bar = 14,500 psi). The crystal specimen in compartment 30 was completely enclosed in the AgCl cylinder 28 thereby allowing a quasi-hydrostatic condition during actual pressing. However, the crystals were first placed into AgCl powder and then pre-pressed to 200 bars at room temperature prior to placing the crystal with the dense AgCl sleeve 20 in the high pressure cell. It is important that the crystals are completely enclosed in dense AgCl (99+% of theoretical density) to accomplish hydrostatic high pressure deformation. Another approach for high pressure deformation at room temperature for the very brittle $TiB_2$ single crystals can be carried out in a simple piston-cylinder type apparatus similar to the one described by L. B. Robinson, F. W. Vahldiek, and C. T. Lynch in U.S. Pat. No. 3,399,256.

The crystal and AgCl sleeve were placed in the high pressure cell which in turn was placed in a high pressure device, and then pressed from 1000 to 25,000 bars at room temperature with the pressure applied at a rate of 1000 bars a minute. The specimens were found to deform three dimensionally into hexagonal, trapezoidal, orthorhombic-tetragonal or bar-like, and cubic shapes after pressing from 5000 to 20,000 bars at room temperature for about 15 minutes. About 50 experiments undertaken placed best reproducible shapes between 15,000 and 18,000 bars applied pressure and were mostly bar-shaped. The deformed crystals were up to 3 mm × 3 mm in cross section and up to 8 mm in length. Some of the deformed specimens had rounded-off edge planes revealing slip by optical and SEM (Scanning Electron Microscopy). Slip of the $\{10\bar{1}0\}$ [0001] and [0001] $<11\bar{2}0>$ types were determined to be operating in $TiB_2$ crystals. Room temperature preferential deformation by hydrostatic pressure on edge planes was determined to be a maximum of 20% by plastic and 80% due to elastic behavior. Laue and cylindrical rotation x-ray diffraction methods and microscopy were used to establish growth and orientation of the crystals. These data allowed then, the accurate slip determination of the deformed $TiB_2$ crystals. Chemical analysis, electron microprobe, and Auger spectroscopy were used to determine impurities and composition of the deformed crystals. These data showed the deformed specimens to be of stoichiometric $TiB_{1.6\pm0.1}$ with no major impurities present and with the same hexagonal crystal structure as $TiB_{2.00}$, where a = 3.022 Å, C = 3.226 Å and c/a = 1.064. Indexing of the new diffraction pattern suggests a higher order of symmetry (orthorhombic) brought about by loss of boron ($TiB_2 \rightarrow TiB_{1.6}$). During crystal growth the inside section of the crystals became boron deficient with additional boron found in the outer region of the as grown crystals by Auger analysis resulting in $TiB_{1.6}$. Microstructure and microhardness studies revealed that two regions exist throughout the cross section of the as grown crystals. The inner most region was found to be 3×3 mm in cross section which pressed "free" after high hydrostatic pressure deformation.

The deformation then occurs by an elastic-plastic mechanism separating two zones from each other in the crystal with the inner zone resulting in the various shapes mentioned above, and the outer zone into crushed irregular particles. Recent crystal growth studies by Nakano et al, as reported in "High Temperature Hardness of IVa Diboride Single Crystals," J. Less-Common Met., 47,259 (1976), substantiates the existence of off-stoichiometric $TiB_2$ crystals. This author reported $TiB_2$ ranging from $TiB_{1.7}$–$TiB_{1.9}$ in composition. Room temperature Knoop and Vickers microhardness measurements on the three planes of the deformed $TiB_{1.6}$ of this invention resulted in hardness data ranging from 2700 to 3300 kg/mm$^2$ in good agreement with earlier data for $TiB_{2.00}$, as reported by Vahldiek et al in "Slip and Microhardness of IVa-IVa Refractory Materials," J. Less-Common Met., 55,265 (1977). The microhardness indentations at loads up to 0.5 kg on hydrostatically deformed crystals revealed plastic deformation by interference fringes.

Mechanical testing in compression of the deformed crystals at room temperature showed again localized slip around the 45° fracture surfaces, and a deformation from 4–6%.

The tetragonal and orthorhombic shaped crystals were measured for electrical resistance using the 4-probe technique. A Hewlett-Packard digital voltmeter, calibrated with a k-3 potentiometer, a Lambda D.C. power supply, a Leeds-Northrup D.C. microvolt amplifier (range 50–2000), and a precision Weston D.C. ammeter were used for resistance measurements. The system was calibrated against standard known resistances of various Cu, Ag, and Au grades, and many other metals and metallic compounds with well known resistances and found to be accurate to within ±2%. Measurements were made at 1, 2 and 3 amps at 5 volts with good reproducibility. The system is considered capable of measuring accurately to $10^{-9}$ ohms for the specimen size used here. The measurable limit lies by about $10^{-11}$ ohms.

The bar-shaped crystals were measured for resistance in three directions. Electrical resistivity determinations resulted in an average of $7 \times 10^{-6}$ ohms cm at room temperature (22° C.) parallel to the c-axis of the specimens. One of the two cross sectional axes revealed much lower voltages or resistances compared with the c-axis. The low resistance measurements were made in the axis perpendicular to the c and also to the a-axis (compare with hexagonal symmetry), meaning also perpendicular to one of the sides of a hexagon. Resistivities ranging from a maximum of $10^{-8}$ ohms cm to less than $10^{-10}$ ohms cm were accurately determined. Zero and even negative resistances were measured on some specimens, as shown in Table I, indicating superconducting behavior of the $TiB_{1.6}$ crystals at room temperature (22° C.).

TABLE I

Electrical Resistivity of $TiB_{1.6}$ at 22° C. Crystal Bar (in ohms cm)

| Specimen No. | Deformation Pressure (Atmosphere) | Parallel to c-axis | Parallel to a-axis | Perpendicular to a-axis |
|---|---|---|---|---|
| 1 | 12,000 | $6.5 \times 10^{-6}$ | $8 \times 10^{-6}$ | $9 \times 10^{31}$ 9 |
| 2 | 16,000 | $12.7 \times 10^{-6}$ | $7.5 \times 10^{-6}$ | $5 \times 10^{-10}$ |
| 3 | 17,500 | $6.2 \times 10^6$ | $6.6 \times 10^{-6}$ | $1 \times 10^{-8}$ |
| 4 | 16.500 | $6 \times 10^{-6}$ | $6.8 \times 10^{-6}$ | 0* |
| 5 | 18,000 | $8 \times 10^{-6}$ | $6 \times 10^{-6}$ | −0.1* |
| 6 | 11,000 | $6.6 \times 10^{-6}$ | $7.2 \times 10^{-6}$ | 0 |
| 7 | 21,000 | $7.0 \times 10^{-6}$ | $8.2 \times 10^{-6}$ | −0.12* |
| 8 | 24,000 | $7.4 \times 10^{-6}$ | $6.4 \times 10^{-6}$ | $7 \times 10^{-10}$ |

*Electrical Resistance, ohms, superconductive

From a consideration of the aforementioned, it can be seen that the present invention provides a method for producing titanium diboride single crystal material that exhibits extraordinary characteristics. These include very high electrical conductivity properties which border on superconductivity at room temperature, and a measurable room temperature ductility under mechanical deformation. Since known superconductivity materials are only effective at cryogenic temperatures, this unexpected increase in conductivity at room temperature greatly enhances the utility of these crystals for a wide variety of electronic uses, especially for fast switching applications under operating conditions of high temperature and stress. Also, since high melting compounds with high hardness and strength are extremely brittle, the discovery of a means for imparting ductility to such materials is of extreme significance since this permits these materials to be used as in the fabrication of jet engine components and other structural elements subjected to an elevated temperature and high stress environment.

While the invention has been described with particularity in reference to a specific embodiment, it is to be understood that the disclosure of the present invention is for the purpose of illustration only and is not intended to limit the invention in any way, the scope of which is defined by the appended claims.

What is claimed is:

1. A process for imparting ductility and increased electrical conductivity to a refractory single crystal which comprises (A) forming a stoichiometrically proportioned specimen of a refractory single crystal; (B) pre-pressing said specimen within an enclosed silver chloride environment at room temperature and a pressure of about 200 atmospheres; (C) placing said pre-pressed specimen enclosed in said silver chloride environment into a pressure cell; (D) compressing said specimen and silver chloride environment to a pressure ranging from about 5,000 to 25,000 atmospheres at a temperature of about 22° C.; and (E) recovering a compressed specimen with a compositional content of less than stoichiometry.

2. A process in accordance with claim 1 wherein said stoichiometrically proportioned refractory single crystal is $TiB_2$ and said recovered compressed specimen has a compositional content of $TiB_{1.6 \pm 0.1}$.

3. A process in accordance with claim 1 or 2 wherein said pressure ranges from about 15,000 to 18,000 atmospheres.

4. A process in accordance with claim 1, 2 or 3 wherein said specimen was compressed at a pressure of about 18,000 atmospheres for a period of about 15 minutes.

* * * * *

UNITED STATES PATENT AND TRADEMARK OFFICE
CERTIFICATE OF CORRECTION

PATENT NO. : 4,349,636
DATED : 14 September 1982
INVENTOR(S) : Fred W. Vahldiek

It is certified that error appears in the above-identified patent and that said Letters Patent are hereby corrected as shown below:

Column 6, Table I should read as follows:

TABLE I
Electrical Resistivity of $TiB_{1.6}$ at $22°C$ Crystal Bar (in ohms cm)

| Specimen No. | Deformation Pressure (Atmosphere) | Parallel to c-axis | Parallel to a-axis | Perpendicular to a-axis |
|---|---|---|---|---|
| 1 | 12,000 | $6.5 \times 10^{-6}$ | $8 \times 10^{-6}$ | $9 \times 10^{-9}$ |
| 2 | 16,000 | $7 \times 10^{-6}$ | $7.5 \times 10^{-6}$ | $5 \times 10^{-10}$ |
| 3 | 17,500 | $6.2 \times 10^{-6}$ | $6.6 \times 10^{-6}$ | $1 \times 10^{-8}$ |
| 4 | 16,500 | $6 \times 10^{-6}$ | $6.8 \times 10^{-6}$ | 0* |
| 5 | 18,000 | $8 \times 10^{-6}$ | $6 \times 10^{-6}$ | -0.1* |
| 6 | 11,000 | $6.6 \times 10^{-6}$ | $7.2 \times 10^{-6}$ | 0 |
| 7 | 21,000 | $7.0 \times 10^{-6}$ | $8.2 \times 10^{-6}$ | -0.12* |
| 8 | 24,000 | $7.4 \times 10^{-10}$ | $6.4 \times 10^{-6}$ | $7 \times 10^{-10}$ |

*Electrical Resistance, ohms, superconductive

Signed and Sealed this

Tenth Day of May 1983

[SEAL]

Attest:

GERALD J. MOSSINGHOFF

Attesting Officer — Commissioner of Patents and Trademarks